United States Patent
Liu et al.

(10) Patent No.: US 9,053,405 B1
(45) Date of Patent: Jun. 9, 2015

(54) PRINTED RFID CIRCUIT

(71) Applicant: Flextronics AP, LLC, Broomfield, CO (US)

(72) Inventors: Weifeng Liu, Dublin, CA (US); Anwar Mohammed, San Jose, CA (US); Murad Kurwa, San Jose, CA (US)

(73) Assignee: Flextronics AP, LLC, Broomfield, CA (US)

( * ) Notice: Subject to any disclaimer, the term of this patent is extended or adjusted under 35 U.S.C. 154(b) by 0 days.

(21) Appl. No.: 14/162,483

(22) Filed: Jan. 23, 2014

Related U.S. Application Data

(60) Provisional application No. 61/870,627, filed on Aug. 27, 2013.

(51) Int. Cl.
  *G06K 19/07* (2006.01)
  *G06K 19/077* (2006.01)
  *H01M 6/40* (2006.01)

(52) U.S. Cl.
  CPC ........... *G06K 19/07754* (2013.01); *H01M 6/40* (2013.01); *H04B 1/3816* (2013.01)

(58) Field of Classification Search
  CPC ....................................................... H01M 6/40
  USPC ........................................................ 235/492
  See application file for complete search history.

(56) References Cited

U.S. PATENT DOCUMENTS

| | | | |
|---|---|---|---|
| 6,621,309 B2 | 9/2003 | Roder et al. | |
| 6,840,743 B2 | 1/2005 | Herke et al. | |
| 6,882,121 B2 | 4/2005 | Herke et al. | |
| 6,927,522 B2 | 8/2005 | Skofljanec | |
| 7,006,761 B2 | 2/2006 | Herke | |
| 8,219,140 B2 * | 7/2012 | Jacobs et al. | 455/550.1 |
| 2009/0160030 A1 | 6/2009 | Tuttle | |
| 2010/0230672 A1 | 9/2010 | Schnitt | |
| 2012/0286936 A1 | 11/2012 | Mullen et al. | |
| 2013/0299597 A1 | 11/2013 | Sinnett et al. | |
| 2014/0047567 A1 | 2/2014 | Haselsteiner et al. | |

* cited by examiner

*Primary Examiner* — Christle I Marshall
(74) *Attorney, Agent, or Firm* — Haverstock & Owens LLP

(57) ABSTRACT

A printed circuit including a non-conductive substrate, a first conductive layer printed on the non-conductive substrate and one or more additional layers printed on the substrate. The first conductive layer is able to have one or more antennas each forming a predetermined pattern, a first conductive sheet and one or more conductive traces. The one or more additional layers include a first electrode printed on the top of the first conductive sheet, a buffer printed on top of the first electrode, a second electrode printed on top of the buffer and a second conductive sheet printed on top of the second electrode. The printed circuit is further able to include an RFID chip electrically coupled with the antennas and at least one of the first and second conductive sheets via the conductive traces, wherein the first and second conductive sheets, the buffer and the first and second electrodes form a power source that provides electrical power to the RFID chip.

20 Claims, 3 Drawing Sheets

PRINTED RFID CIRCUIT

CROSS-REFERENCE TO RELATED APPLICATION

The present application claims priority under 35 U.S.C. 119 to U.S. Provisional Application No. 61/870,627 entitled "INTERCONNECT METHODS," filed on Aug. 27, 2013, the contents of which are incorporated herein as if set forth in full.

FIELD OF THE INVENTION

The present invention relates to the field of radio frequency identification (RFID) chip circuits. More particularly, the present invention relates to printed RFID chip circuits.

BACKGROUND

Circuits, and in particular circuits utilizing RFID chips or tags are becoming more and more popular in the electronic industry. In particular, the ability to create and implement very simple RFID chips in numerous applications has led to their use as readers/transmitters in a multitude of applications. However, as a tradeoff for their simple design, these RFID chips often lack needed functionality and thus must be incorporated into a greater circuit in order to provide the desired product functionality to a user. Unfortunately, in order to add the circuit components the provide the additional functionality, the manufacturing costs are increased and the components can be rigid, fragile and/or have a large footprint such that they severely inhibit many of the advantages gained by using the RFID chips used alone. Thus, designers are forced to choose between cheaper circuits that fully take advantage of the simplicity of the RFID chips, but have less functionality or more expensive circuits that incorporate additional components electrically coupled to the RFID chips, but often detract from the savings, flexibility and other advantages gained by utilizing the RFID chips.

SUMMARY OF THE INVENTION

Embodiments of a printed circuit and method of manufacture thereof are directed to an electronic circuit comprising an RFID chip electrically coupled with a plurality of printed electronics in order to provide a cheap, but versatile printed circuit. For example, the RFID chip is able to be using in a powered RFID circuit wherein the power source, the antenna and one or more additional electrical components are simultaneously manufactured using a printing method. In particular, because all of the components except for the RFID chip are printed, each individual layer that is printed is able to comprise some or all of multiple different components. Thus, a first layer of a printed battery is able to also comprise an antenna and the first layer of a resistor or other electrical components. Because the layers are able to be cross component layers, the cost of manufacturing the circuit is reduced while still providing the additional components to supplement the capabilities of the RFID chip.

A first aspect is directed to a printed circuit. The printed circuit comprises a non-conductive substrate, a first conductive layer printed on the non-conductive substrate and one or more additional layers printed on the substrate. The first conductive layer comprises one or more antennas each forming a predetermined pattern, a first conductive sheet and one or more conductive traces. The one or more additional layers comprise a first electrode printed on the top of the first conductive sheet, a buffer printed on top of the first electrode, a second electrode printed on top of the buffer and a second conductive sheet printed on top of the second electrode. The printed circuit further comprises an RFID chip electrically coupled with the antennas and at least one of the first and second conductive sheets via the conductive traces, wherein the first and second conductive sheets, the buffer and the first and second electrodes form a power source that provides electrical power to the RFID chip. In some embodiments, the RFID chip is the only non-printed element on the substrate forming the printed circuit. In some embodiments, the power source comprises a printed battery and the buffer comprises an electrolyte that isolates the first and second electrodes. In some embodiments, the electrolyte has a lateral perimeter that is slightly larger than the lateral perimeter of the first and second electrodes such that the first and second electrodes do not extend beyond the lateral perimeter of the electrolyte. In some embodiments, the power source comprises a printed battery and the buffer comprises a photoactive layer and a transport layer. In some embodiments, the printed circuit further comprises one or more printed electrical components, wherein each of the printed electrical components are at least partially printed within the first conductive layer and the remainder of the printed electrical components are printed within the additional layers. In some embodiments, the printed electrical components comprise one or more of printed resistors, printed capacitors, printed light-emitting diodes and printed memory cells. In some embodiments, the RFID chip is electrically coupled to the traces with a conductive adhesive. In some embodiments, the entirety of the first conductive layer is formed by a single conductive material. In some embodiments, the single conductive material is one of copper, palladium, gold, silver, and nickel.

A second aspect is directed to a method of manufacturing a printed circuit. The method comprises providing a non-conductive substrate, printing a first conductive layer onto the substrate, the first conductive layer comprising one or more antennas each forming a predetermined pattern, a first conductive sheet and one or more conductive traces, printing one or more additional layers onto the substrate, the additional layers comprising a first electrode printed on the top of the first conductive sheet, a buffer printed on top of the first electrode, a second electrode printed on top of the buffer and a second conductive sheet printed on top of the second electrode and placing an RFID chip on the substrate and electrically coupling the RFID chip with the antennas and at least one of the first and second conductive sheets via the conductive traces, wherein the first and second conductive sheets, the buffer and the first and second electrodes form a power source that provides electrical power to the RFID chip. In some embodiments, the RFID chip is the only non-printed element on the substrate forming the printed circuit. In some embodiments, the power source comprises a printed battery and the buffer comprises an electrolyte that isolates the first and second electrodes. In some embodiments, the electrolyte has a lateral perimeter that is slightly larger than the lateral perimeter of the first and second electrodes such that the first and second electrodes do not extend beyond the lateral perimeter of the electrolyte. In some embodiments, the power source comprises a printed battery and the buffer comprises a photoactive layer and a transport layer. In some embodiments, the first conductive layer comprises at least a portion of one or more printed electrical components and the additional layers comprise the remainder of the printed electrical components. In some embodiments, the printed electrical components comprise one or more of printed resistors, printed capacitors, printed light-emitting diodes and printed memory cells. In some embodiments, the RFID chip is electrically coupled to the traces with a conductive adhesive. In some embodiments, the entirety of the first conductive layer is formed by a single conductive material via a single printing process. In some embodiments, the single conductive material is one of copper, palladium, gold, silver, and nickel.

Other features of the present invention will become apparent from consideration of the following description taken in conjunction with the accompanying drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION

In the following description, numerous details and alternatives are set forth for the purpose of explanation. However, one of ordinary skill in the art will realize that the invention can be practiced without the use of these specific details. In other instances, well-known structures and devices are shown in block diagram form in order not to obscure the description of the invention with unnecessary detail.

The printed circuit and method of manufacture described herein is designed to provide inexpensive RFID circuits that are able to reduce costs by printing the entirety of the circuit that couples to the RFID chip. In particular, by entirely using printed components to complement the RFID chip, single layers are able to be printed on the desired substrate, wherein each of the single layers are able to comprise portions or all of multiple different types of circuitry. This parallel processing/manufacture of different components reduces the cost of the components and thus the cost of the overall circuit. This is in contrast to traditional components, which require separate processing via non-printing methods such as vacuum deposition, sputtering, ion-plating, and/or non-electrolytic plating. As a result, the cost, flexibility, durability and other benefits provided by RFID chips are able to be secured while still enabling additional functionality to be added to the circuit via the additional printed components.

Figure 1:
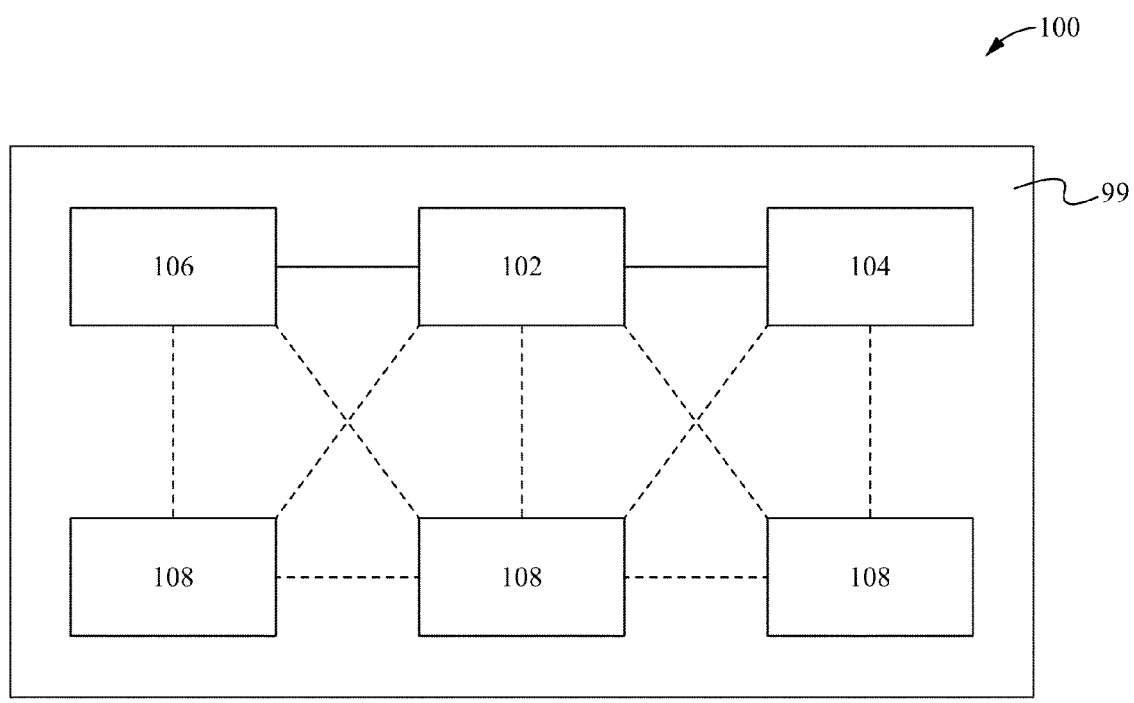
FIG. 1 illustrates a printed circuit system according to some embodiments.

FIG. 1 illustrates a printed circuit system 100 according to some embodiments. As shown in FIG. 1, the system 100 comprises an RFID chip 102 electrically coupled with a printed power source 104 and a printed antenna 106 on a non-conductive substrate 99. The chip 102, power source 104 and antenna 106 are each able to be electrically coupled with one or more additional printed electrical components 108, which are also able to be electrically coupled to each other, as indicated by the hashed lines. Thus, all the components of the system 100 except for the RFID chip 102 are printed components that are able to be added to the circuit and applied to the substrate utilizing a printing method. As a result, the system 100 provides the benefit of saving cost by printing the entire circuit system 100 on the substrate 99 such that only the RFID chip 102 must be placed via a non-printing method.

It is understood that although the printed circuit system 100 of FIG. 1 illustrates one way of electrically coupling the components 102-108, other configurations are contemplated wherein any component 102-108 is able to electrically couple with any number of the other components. Further, although FIG. 1 only shows a single chip 102, printed power source 104 and printed antenna 106, the system 100 is able to comprise any number of RFID chips 102, printed power sources 104 and/or printed antennas 106. Similarly, although FIG. 1 illustrates three additional printed electrical components 108, the system 100 is able to comprise more or less electrical components 108. Additionally, one or more of the components 102-108 shown in FIG. 1 are able to be omitted from the printed circuit system 100 as desired.

Figure 2B:
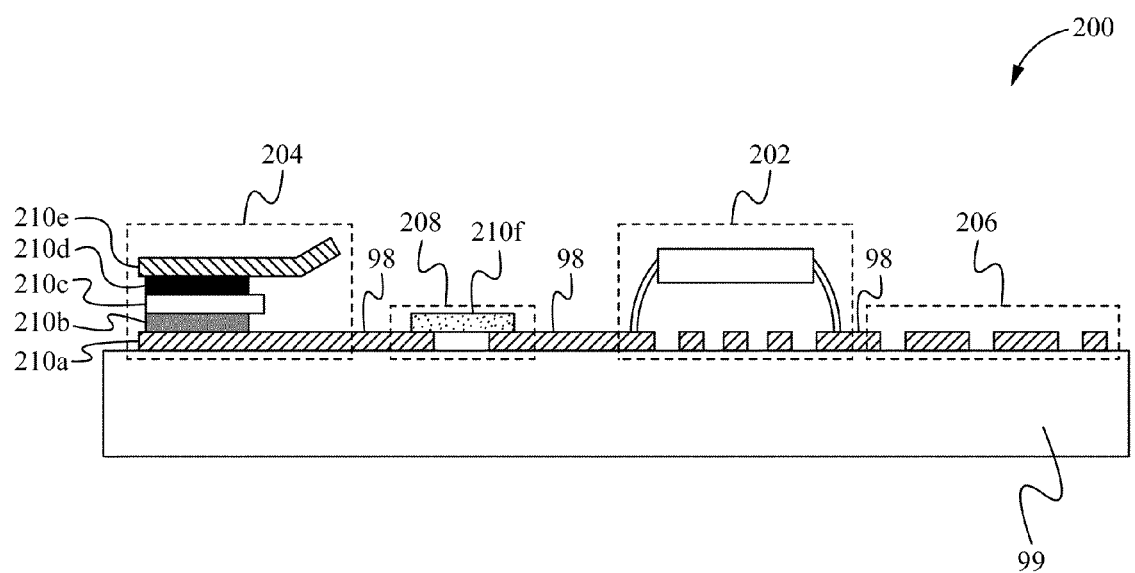
FIG. 2B illustrates a side view of a printed circuit according to some embodiments.
Figure 2A:
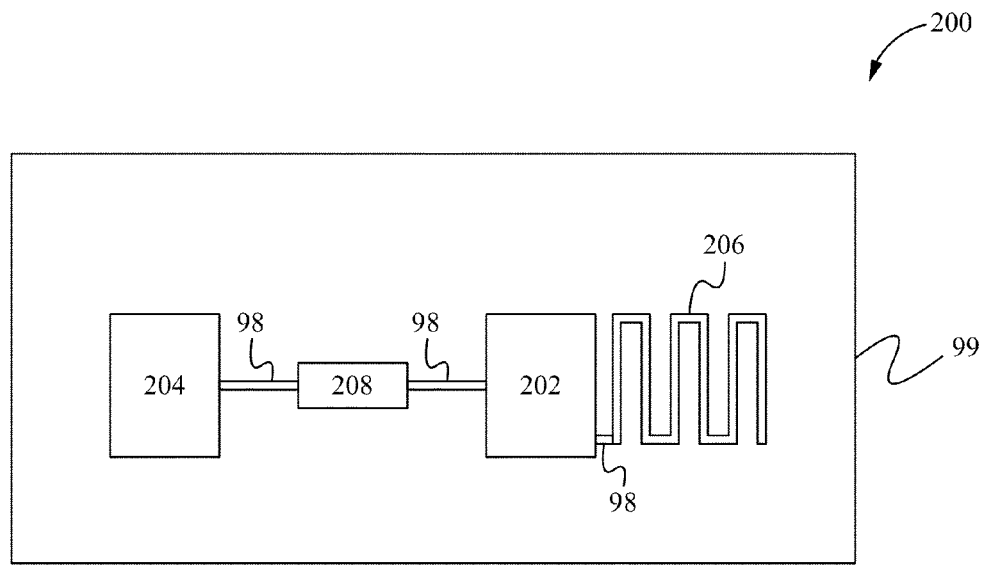
FIG. 2A illustrates a top views of a printed circuit according to some embodiments.

FIGS. 2A and 2B illustrate top and side views, respectively, of a printed circuit 200 according to some embodiments. As shown in FIG. 2A, the printed circuit 200 comprises a RFID chip 202 on a non-conductive substrate 99 and electrically coupled with a printed power source 204, a printed electrical component 208 and a printed antenna 206 via one or more printed conductive traces or wires 98. Although FIGS. 2A and 2B show a printed circuit 200 having a single RFID chip 202, a single printed power source 204, a single printed electrical component 208 and a single printed antenna 206 coupled together in a single manner via one or more printed conductive 98, other configurations are contemplated including additional or less components 202-208 and/or coupled together by one or more traces 98 in different manners as desired. As shown in FIG. 2B the printed power source 204, printed electrical component 208, printed antenna 206 and printed traces 98 are all formed by one or more of a plurality of printed layers 210a-210f printed on the substrate 99. In particular, the printed layer 210a forms a portion of the power source 204 and the electrical component 208, and the entirety of the traces 98 and the antenna 206. As a result, portions or all of multiple different components are able to be printed simultaneously or in parallel by printing the layer 210a thereby reducing manufacturing steps and/or costs. In some embodiments, some or all of the circuit 200 is able to be protected by a mold that encases some or all of the circuit 200. For example, some or all of the circuit 200 is able to be protected by elastomers molded onto the circuit 200.

Although in FIG. 2B a single layer 210a is common to all the printed components 204-208 and traces 98, each layer 210 is able to form or not form at least a portion of one or more of the components 204-208 and/or traces 98. In other words, each individual printed component of the circuit 200 is able to include one, a plurality, or all of the layers 210. Each of the printed layers 210a-e are able to be electrically conductive or non-conductive materials as desired. For example, one or more of the layers 210 are able to be conductive while the remaining layers are non-conductive. Additionally, each of the printed layers 210a-e are able to be the same or different conductive or non-conductive material. For example, one conductive layer is able to be copper while another conductive layer is able to be silver. In some embodiments, the material forming the layers 210 are one of metallic conductors such as copper, silver, aluminum, gold, nickel and palladium, organic materials, semi-organic materials, inorganic materials, conductive or non-conductive adhesives or epoxies, insulating electrolytes, conductive or non-conductive organic materials such as carbon and/or other types of solution based materials known in the art. Further, the layers 210 are able to be in the form of nanoparticles, nanotubes, or other types of printable materials or printable inks.

The substrate 99 is able to comprise one or more of printed circuit board, ceramic, cloth, polycarbonate (PC), polyethylene naphthalate (PEN), liquid crystal polymer (LCP), mylar, paper, plastic, kapton, Poly(ethylene terephthalate)-foil (PET), poly(imide)-foil (PI), glass, silicon, flexible foil, flex or other types of substrate materials. In some embodiments, the RFID chip 202 is electrically coupled to the circuit via a conductive adhesive such as a conductive epoxy or anisotropic conductive paste. Alternatively, other forms of conductive adhesives are able to be uses such as solder. The conductive adhesive material is able to be filled or unfilled. For example, the adhesive material is able to be filled with one or more conductive particles such as NiAu particles. Alternatively, other types of filler are able to be used. The RFID chip 202 is able to comprise one or more desired integrated circuits and/or a non-transitory computer-readable memory that stores data. This data is able to be read by a reader when communicating with the chip 202. In some embodiments, the reader is also able to add new data and/or edit the data on the chip 202. In other words, the memory is able to be read-write memory, read-only memory, write-once read-many memory or other types of memory. In some embodiments, the RFID chip 202 is a passive chip. Alternatively, the chip 202 is able to be active (having a battery the power active transmission), semi-passive (having a battery to run the chip 202, but not to power active transmission) or passive (having no battery).

In some embodiments, the power source 204 is able to be a printed battery wherein the layer 210a is a first conductive current collector, the second layer 210b is a cathode (or anode) layer, the layer 210c is an insulating electrolyte layer, layer 210d is an anode (or cathode) layer and layer 210e is a second conductive current collector. As a result, the voltage stored between the anode and cathode layer is able to be provided to the remainder of the circuit 200 via one of the current collectors. Alternatively, the power source 204 is able to be a solar cell that is similar to the printed battery except the insulating electrolyte layer (layer 210c) is replaced by two layers, a photoactive layer adjacent to the cathode and a transport layer between the photoactive layer and the anode. Alternatively, the power source 204 is able to comprise one or more other types of printable power sources as are well known in the art. In some embodiments, the additional electrical component 208 is able to be a printed resistor wherein the layer 210a forms first and second terminals and the layer 210f forms a resistive conductor having a specified electrical resistance greater than that of the layer 210a. Alternatively, the additional electrical component 208 is able to be a printed capacitor, switch, transistor, memory cell, light emitting diode or other printed electrical component. As a result, the printed circuit 200 is able to provide the benefit of incorporating numerous different printed components to an RFID chip thereby increasing the functionality of the chip without undermining its cost effectiveness.

Figure 3:
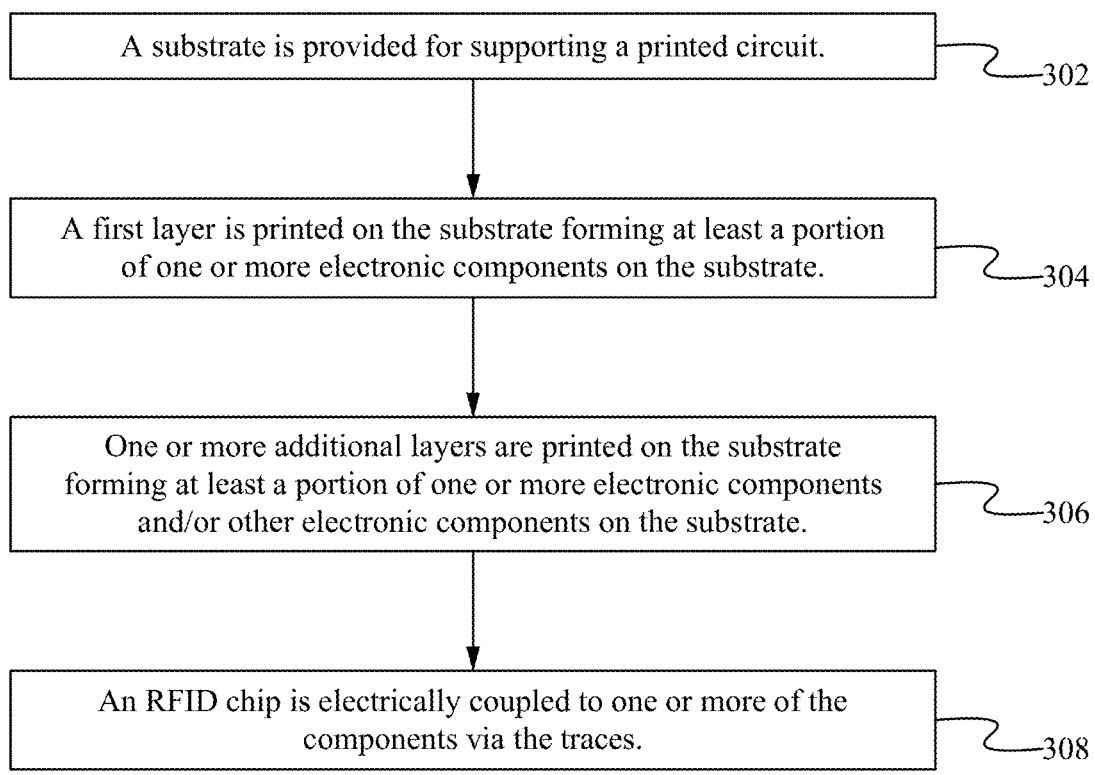
FIG. 3 illustrates a flow chart of a method of manufacturing a printed circuit according to some embodiments.

FIG. 3 illustrates a flow chart of a method of manufacturing a printed circuit according to some embodiments. At the step 302, a substrate 99 is provided for supporting a printed circuit. In some embodiments, the substrate 99 is non-conductive and/or flexible. At the step 304, a first layer 210a is printed on the substrate 99. In some embodiments, the first layer 210a comprises at least a portion of a plurality of printed components. For example, the first layer 210a comprises at least a portion of one or more printed power sources 204, one or more printed electrical components 208, one or more printed antennas 206 and/or one or more printed conductive traces 98. Alternatively, the first layer 210a is able to comprise only at least a portion of a single printed component one the substrate 99. In some embodiments, the one or more printed electrical components 208 comprise one or more of a printed resistor, capacitor, switch, transistor, memory cell, light emitting diode or other printed electrical component. In some embodiments, the printed power sources 204 comprise one or more of a printed battery, a printed solar cell or other printed power sources. In some embodiments, the first layer 210a is printed on the substrate 99 via screen printing, gravure, flex or flexographic printing, offset lithography, inkjet, aerosol inkjet, stencil or other types of sheet based or roll-to-roll printing methods. In some embodiments, the first layer 210a is conductive. Alternatively, the first layer 210a is able to be non-conductive.

At the step 306, one or more additional layers 210 are printed on the substrate 99. In some embodiments, some or all of the additional layers 210 are formed on top of one of the previous applied layers 210 (e.g. the first layer 210a). In some embodiments, the one or more additional layers 210 comprise at least a portion of a plurality of printed components. For example, the additional layers 210 are able to provide the remainder of components partially formed by the first layer 210a and/or provide portions or all of one or more separate printed components on the substrate 99. In some embodiments, the additional layers 210 are printed on the substrate 99 via one or more of screen printing, gravure, flexographic printing, offset lithography, inkjet, aerosol inkjet, stencil or other types of sheet based or roll-to-roll printing methods. In some embodiments, the printing method used for one layer of the additional layers 210 and/or the first layer 210a is able to be different than the method used for printed any of the other additional layers 210 (and/or first layer 210a). The additional layers 210 are each able to be conductive or non-conductive. Although as described herein the first layer 210a is printed on the substrate 99 before the additional layers 210, it is understood that the first layer 210a is able to be printed after or in between the printing of one or more of the additional layers 210. Additionally, it is contemplated that more or less printed electrical components are able to be printed onto the substrate 99 as desired.

In some embodiments, in forming a power source 204 the first and/or additional printed layers 210 are able to comprise a first layer that is a first conductive current collector, a second layer that is a cathode (or anode) layer, the third layer that is an insulating electrolyte layer, a fourth layer that is an anode (or cathode) layer and fifth layer that is a second conductive current collector. Alternatively, in forming the power source 204 the first and/or additional printed layers 210 are able to replace the third layer with two layers, a photoactive layer adjacent to the cathode and a transport layer between the photoactive layer and the anode. Alternatively, other power source 204 forming layer configurations are able to be used.

At the step 308, an RFID chip 202 is electrically coupled to one or more of the components via the traces 98. In some embodiments, the electrical coupling comprises using a conductive adhesive to electrically couple the contacts of the RFID chip 202 to the contact pads of the traces 98. Alternatively, other electrical coupling methods are able to be used. In some embodiments, the conductive adhesive is then cured utilizing ultraviolet curing. Alternatively, one or more of ultraviolet curing, heat curing, other types of curing or a combination thereof is able to be used immediately or non-immediately to cure the adhesive. As a result, the method is able to provide the advantage of providing RFID circuits with enhanced functionality via printed components.

The printed circuit and method of manufacture described herein has numerous advantages. Specifically, the embedded printed circuit is designed to provide inexpensive RFID circuits that are able to reduce costs by printing the entirety of the circuit that couples to the RFID chip. In particular, by entirely using printed components to complement the RFID chip, single layers are able to be printed on the desired substrate, wherein each of the single layers are able to comprise portions or all of multiple different types of circuitry. This parallel processing/manufacture of different components reduces the cost of the components and thus the cost of the overall circuit. This is in contrast to traditional components, which require separate processing via non-printing methods such as vacuum deposition, sputtering, ion-plating, and/or non-electrolytic plating. As a result, the cost, flexibility, durability and other benefits provided by RFID chips are able to be secured while still enabling additional functionality to be added to the circuit via the additional printed components.

The printed circuit and method of manufacture has been described in terms of specific embodiments incorporating details to facilitate the understanding of the principles of construction and operation of the printed circuit. The specific configurations shown and the methodologies described in relation to the various modules and the interconnections there between are for exemplary purposes only. Such reference herein to specific embodiments and details thereof is not intended to limit the scope of the claims appended hereto. It will be apparent to those skilled in the art that modifications may be made in the embodiments chosen for illustration without departing from the spirit and scope of the printed circuit system.

What is claimed is:

1. A printed circuit comprising:
    a non-conductive substrate;
    a first conductive layer printed on the non-conductive substrate comprising:
        one or more antennas each forming a predetermined pattern;
        a first conductive sheet; and
        one or more conductive traces;
    one or more additional layers printed on the non-conductive substrate comprising:
        a first electrode printed on the top of the first conductive sheet;
        a buffer printed on top of the first electrode;
        a second electrode printed on top of the buffer; and
        a second conductive sheet printed on top of the second electrode; and
    an RFID chip electrically coupled with the antennas and at least one of the first and second conductive sheets via the conductive traces;
    wherein the first and second conductive sheets, the buffer and the first and second electrodes form a power source that provides electrical power to the RFID chip.

2. The printed circuit of claim 1, wherein the RFID chip is the only non-printed element on the substrate forming the printed circuit.

3. The printed circuit of claim 1, wherein the power source comprises a printed battery and the buffer comprises an electrolyte that isolates the first and second electrodes.

4. The printed circuit of claim 3, wherein the electrolyte has a lateral perimeter that is slightly larger than the lateral perimeter of the first and second electrodes such that the first and second electrodes do not extend beyond the lateral perimeter of the electrolyte.

5. The printed circuit of claim 1, wherein the power source comprises a printed battery and the buffer comprises a photoactive layer and a transport layer.

6. The printed circuit of claim 1, further comprising one or more printed electrical components, wherein each of the printed electrical components are at least partially printed within the first conductive layer and the remainder of the printed electrical components are printed within the additional layers.

7. The printed circuit of claim 6, wherein the printed electrical components comprise one or more of printed resistors, printed capacitors, printed light-emitting diodes and printed memory cells.

8. The printed circuit of claim 1, wherein the RFID chip is electrically coupled to the traces with a conductive adhesive.

9. The printed circuit of claim 1, wherein the entirety of the first conductive layer is formed by a single conductive material.

10. The printed circuit of claim 9, wherein the single conductive material is one of copper, palladium, gold, silver, and nickel.

11. A method of manufacturing a printed circuit, the method comprising:
    providing a non-conductive substrate;
    printing a first conductive layer onto the substrate, the first conductive layer comprising:
        one or more antennas each forming a predetermined pattern;
        a first conductive sheet; and
        one or more conductive traces;
    printing one or more additional layers onto the substrate, the additional layers comprising:
        a first electrode printed on the top of the first conductive sheet;
        a buffer printed on top of the first electrode;
        a second electrode printed on top of the buffer; and
        a second conductive sheet printed on top of the second electrode; and
    placing an RFID chip on the substrate and electrically coupling the RFID chip with the antennas and at least one of the first and second conductive sheets via the conductive traces;
    wherein the first and second conductive sheets, the buffer and the first and second electrodes form a power source that provides electrical power to the RFID chip.

12. The method of claim 11, wherein the RFID chip is the only non-printed element on the substrate forming the printed circuit.

13. The method of claim 11, wherein the power source comprises a printed battery and the buffer comprises an electrolyte that isolates the first and second electrodes.

14. The method of claim 13, wherein the electrolyte has a lateral perimeter that is slightly larger than the lateral perimeter of the first and second electrodes such that the first and second electrodes do not extend beyond the lateral perimeter of the electrolyte.

15. The method of claim 11, wherein the power source comprises a printed battery and the buffer comprises a photoactive layer and a transport layer.

16. The method of claim 11, wherein the first conductive layer comprises at least a portion of one or more printed electrical components and the additional layers comprise the remainder of the printed electrical components.

17. The method of claim 15, wherein the printed electrical components comprise one or more of printed resistors, printed capacitors, printed light-emitting diodes and printed memory cells.

18. The method of claim 11, wherein the RFID chip is electrically coupled to the traces with a conductive adhesive.

19. The method of claim 11, wherein the entirety of the first conductive layer is formed by a single conductive material via a single printing process.

20. The method of claim 19, wherein the single conductive material is one of copper, palladium, gold, silver, and nickel.

* * * * *